United States Patent [19]

Lieberman et al.

[11] Patent Number: 4,894,273
[45] Date of Patent: Jan. 16, 1990

[54] BONDING ADDITIVES FOR REFRACTORY METALLIZATION INKS

[75] Inventors: Sheldon I. Lieberman, Burlington; Eric A. Barringer, Waltham; Brian C. Foster, Sutton, all of Mass.

[73] Assignee: Ceramics Process Systems Corp., Milford, Mass.

[21] Appl. No.: 207,394

[22] Filed: Jun. 16, 1988

Related U.S. Application Data

[63] Continuation-in-part of Ser. No. 53,323, May 22, 1987, abandoned.

[51] Int. Cl.$^4$ .................................................. B32B 3/10
[52] U.S. Cl. ..................................... 428/137; 428/209; 428/210; 428/426; 428/432; 428/433; 428/901; 428/689; 428/697; 106/1.12; 106/1.21; 106/1.24; 106/1.27; 106/1.28; 75/233; 75/235; 75/245; 75/248; 252/508; 252/513; 252/514; 252/515; 252/516

[58] Field of Search ............... 428/137, 209, 210, 426, 428/432, 433, 901, 689, 697, 699, 472, 698, 704; 106/1.12, 1.21, 1.24, 1.27, 1.28; 75/233, 245, 235, 248; 252/508, 513, 514, 515, 516

[56] References Cited

U.S. PATENT DOCUMENTS 4,340,618 7/1982 Fury et al. .............................. 427/96
4,684,446 8/1987 Charles et al. ......................... 427/96

*Primary Examiner*—Ellis P. Robinson
*Assistant Examiner*—P. J. Ryan
*Attorney, Agent, or Firm*—Bradley N. Ruben

[57] ABSTRACT

Bonding additives for refractory metallization compositions allow for circuit traces having good resistivities and adhesion values in excess of 6 kpsi, generally between about 10 and 20 kpsi. The inks are provided in formulations devoid of a glass component, and are suitable for co-sintering circuit traces and vias with 96% alumina substrates, and especially for 99% alumina substrates. Suitable bonding additives are the oxides of molybdenum, tungsten, niobium, manganese, yttrium, and titanium, or mixtures of such oxides.

20 Claims, No Drawings

BONDING ADDITIVES FOR REFRACTORY METALLIZATION INKS

This application is a continuation-in-part of co-pending U.S. application Ser. No. 053,323, filed May 22, 1987, now abandoned the disclosure of which is incorporated herein by reference.

BACKGROUND OF THE INVENTION

1. Field of the Invention

This invention relates to a process and compositions useful for forming conductive paths in and on substrates and packages suitable for thick film or thin film applications. In particular, the compositions are useful for forming both circuit traces and dense vias having high bond strengths, low resistivities, a narrow distribution of resistance values, and high thermal conductances. The traces and vias may also be made hermetic.

2. The State of the Art

Substrates for electronic circuitry are one of the most important applications for high performance ceramics in the microelectronics industry. The circuit traces are applied using thick film and thin film techniques. In the case of single layer substrates, conductors and other trace components (resistors, capacitors, etc.) are positioned on the top and bottom of such substrates, with conductive vias positioned through the substrate for connecting the top and bottom circuitry. The electromechanical property requirements for traces and vias in thick film hybrid circuits are generally not difficult to meet; however, because of the high performance and high costs associated with thin film hybrids, the circuitry, including the vias, has stringent property requirements and must be fabricated with precision. For both traces and vias, two important requirements are low electrical resistance and good bonding/adhesion to the substrate. Further, and particularly regarding thick film circuitry which is co-sintered with the substrate, the shrinkage of the circuit paths must conform to that of the substrate while also developing a strong bond thereto.

Multi-layer metallized ceramic packages are typically constructed from a green tape, generally composed of ceramic particles and an organic binder; the tape layers typically have a thickness ranging from about 5 to about 25 mils. After the tape is cut into sections, metallized trace patterns for circuits and power and ground planes are applied to the surface of the sections, and metallized vias are created through the sections. Thereafter, multiple layers are stacked, laminated under heat and pressure, and the entire structure is sintered to form a monolithic structure having three-dimensional circuitry. The traces form circuit patterns on the surface of a substrate section (including power and ground planes) and the vias interconnect the surface traces on different layers.

The ceramic portion of the tape is typically formed from a combination of approximately 90–96% commercial alumina (crystalline) and 4–10% silicon-based glass. The metallization ink or paste is typically composed of metal particles (such as tungsten, molybdenum, or a combination of molybdenum and manganese), an organic vehicle, and often glass and/or ceramic to promote adhesion of the metallization to the substrate during co-sintering. Glass is usually present in the substrate formulation to promote bonding of the metallization to the substrate and to allow for lower temperature sintering of the substrate, as previously noted. In prior art metallization formulations without glass, such as based on 100% tungsten particles, a glass component would be present in the substrate, which during sintering migrates into the tungsten layer, thereby providing interfacial adhesion between the metallization and the substrate.

Circuit packages produced from typical prior art formulations (i.e., those containing glass) display a dielectric constant of approximately 9–9.5, a thermal conductivity of approximately 0.045 cal-cm/cm$^2$-sec-°C. at 20° C. (compared with 0.085 for 99.5% alumina), a shrinkage variability of 0.5%–1.0%, and a surface finish of greater than about 25 microinches. While these substrate properties may have been acceptable for conventional semiconductor packages, they are inadequate for high-performance large scale integration circuitry. Accordingly, there is a need for metallization compositions which exhibit controlled shrinkage and achieve good adhesion during co-sintering; also, the sintered metallization should have a low resistivity and a high bond strength.

Particularly for thin film applications, such as thin film hybrid packages, metallized vias must be formed in the substrates. Thin film substrates are typically 99.5+% alumina in which vias are formed by "drilling" a hole in the substrate, the inside of which is then coated with a thin layer of metal, typically using lithography, vapor deposition methods, or plating processes. Because of the small tolerances required for the hole position (typically ±3 mils absolute, or about 1 mil/inch) for thin film processing, laser drilling of the via holes is commonly practiced. Although precise hole position is possible with laser systems, many problems are yet associated with this method. Slag, microcracks, and other defects are often generated in the substrate near the via holes; these defects can degrade the adhesion and quality of the subsequently applied metallization. Also, reproducible, high quality metallization of laser drilled holes is difficult to achieve. In turn, this can result in an unacceptably broad distribution of resistance values for the vias, which is manifest as low process yields. Additionally, the drilling causes residual stresses around via holes. These stresses can be sufficiently large to cause fracture of the substrate during subsequent assembly operations, particularly during soldering. If this occurs in the final assembly steps of an electronic subsystem, such yield losses can be very costly. Although the stresses may be reduced by heat treating laser drilled substrates prior to metallizing, the product quality is still less than desirable.

Lower cost and potentially higher yield methods for forming via holes have been investigated in recent years. One method is the fabrication of prepunched thin film substrates. Thin film substrates are typically fabricated using a doctor blade process to form a green tape, as described above. Holes are punched into the green tape or tape sections prior to sintering using hard tooling or a numerically controlled punch press. Extreme care is required during tape processing to avoid the introduction of surface defects into the final substrate. The manufacturing of defect-free, smooth substrates, suitable for thin film applications, is made more difficult when via holes are punched into the green tape; yet the quality of such holes is usually sufficient to achieve both a significant cost reduction and improvements in subsequent metallization. However, the use of the prepunched via method is limited by the poor accuracy in positioning the via holes in the fired substrate; the current art in tape technology achieves position tolerances in the range of ±0.3 to 1.0% (3–10 mil/inch) because of the variabilities in shrinkage during sintering.

Accordingly, there is a need for methods of producing high quality thin film substrates having metallized vias, which vias have a more uniform distribution of and lower resistivities. Such methods should achieve higher yields and lower fabrication costs, and should also leave minimal residual stress in the area of the substrate integral with the via hole. There is also a need for substrates having dense, hermetic vias; although desirable for certain applications, hermeticity is not possible using current art thin film techniques for metallizing vias. It would also be desirable to provide these aspects in substrates having a higher thermal conductance than those currently produced, and to develop methods applicable to thick film substrates.

One proposed approach has been to co-sinter the metallized traces and vias along with the green ceramic tape. As practiced, traces are laid down using screen printing and via holes are filled with a conventional thick film conductor ink, after which the metallized substrate is co-fired in a reducing atmosphere at high temperatures (e.g., 1500° to 1650° C.). Although this method is suitable for thick film substrates (as discussed above, typically composed of 90–96% alumina and 4–10% glass), little success has been demonstrated with co-sintered circuit traces and vias in substrates and packages comprising greater than about 96% alumina.

The principle reason for this failure (or, at best, very limited success), has been the inadequacy of the applied metallization technology. More particularly, current metallization compositions exhibit poor bonding strengths when used in combination with >96% alumina. In fact, the present industry standard for the bond strength of glass-alumina substrates and packages made therewith is generally in the range of about 4 to 6 kpsi (as quoted by Interamics and Kyocera, respectively). These strength characteristics limit the attachment of lead frames, lids, flanges, and other structures which allow for protection of the active device or for interconnections critical to the performance of the substrate or package. In addition, such metallization compositions exhibit high resistivities (greater than about $6.7 \times 10^{-3}$ ohm-cm) and low thermal conductivities; these can be cause by porosity in the metallization and/or by the presence of glass in the metal phase, both of which reduce the desired thermal and electrical properties. Also, hermeticity of the metallization has also not been possible. Still further, the technology for shrinkage tolerances required during co-sintering does not yet provide acceptable results; high shrinkage tolerance is required to achieve high yields of substrates having precisely positioned traces and vias (generally, ±0.2% is required). Reduction in shrinkage variability from the current art level of 0.5–1.0% is especially important as feature size decreases and would also provide for increased yields. This is because variability in shrinkage prevents precise location of integrated circuit traces, vias, and other device interconnections, as well as increasing the probability for discontinuities and thus necessitating rejecting the product for poor quality. The need for reduction in shrinkage variability extends to both the manufacturer of substrates and the substrate consumer, who require precise positioning of devices and interconnections and, in a few special cases, reliable circuit personalization by thin-film metallization.

Accordingly, there exists a need for a substrate/metallization system with higher bond strengths, greater thermal conductivities, lower shrinkage variability, and a better substrate surface finish, especially for thin film hybrid packages, while also maintaining the desired dielectric, electrical, and mechanical properties.

SUMMARY OF THE INVENTION

We have discovered that particular bonding additives for metallization compositions provide the ability to co-sintered such metallizations with high purity alumina (>96%) and to achieve an excellent bonding strength, controlled shrinkage, and a low resistivity. These metallization compositions can be modified to tailor their electromechanical properties, such as for either circuit traces or vias. These metallization compositions are essentially devoid of any glass, although they may contain small amounts of sintering aids.

The present invention provides a metallization composition comprising (a) a metallization portion, consisting essentially of 84–97% refractory metal, 2–10% alumina, 0.05–5% sintering aid, and 0.5–5% bonding additive, and (b) a vehicle portion. Used for a trace pattern, the metallization preferably comprises 88–97% refractory metal, 2–8% alumina, 0.05–1% sintering aid, and 0.5–3% bonding additive; used for a via hole, the ink preferably comprises 84–97% refractory metal, 2–10% alumina, 0.05–5% sintering aid, and 0.5–5% bonding additive. The bonding additive is an oxide of at least one of molybdenum, tungsten, magnesium, niobium, manganese, yttrium, and titanium. The present invention also provides a ceramic body composed of >96% alumina having inks of such metallization compositions co-sintering therewith.

DESCRIPTION OF SPECIFIC EMBODIMENTS

The present metallization compositions, suitable for both thick film circuit paths and conductive vias, generally include a refractory metal, a sintering aid, and a bonding additive. These inks are suitable for co-sintering with >96% alumina substrates; preferably, the substrates are >99% or even >99.5% alumina. More particularly, these inks are composed of 84–97% refractory metal, 2–10% alumina, 0.05–5% sintering aid, and 0.5–5% bonding additive (all amounts herein are by weight, based on total solids composition, unless otherwise noted).

The refractory metals can be tungsten or molybdenum, or mixtures thereof, generally used in the form of a powder. Exemplary refractory powders are tungsten powders designated M-10, M-20, and M-40, available from GTE Sylvania, Towanda, PA. These powders have average particle sizes of approximately 0.6 micron, 1.0 micron, and 3 microns, respectively.

The sintering aid, which enhances the densification of the refractory metal during sintering, can be any of those known in the art, such as nickel, cobalt, palladium, manganese, the oxides thereof, and mixtures thereof. Sintering can also be enhanced by using finer particle sizes and by pre-reducing the refractory powder (i.e., removing any oxide components, which often form upon exposure to air) prior to formulating the metallization composition. Improved sintering provides greater hermeticity, i.e., the sealing of gases from the substrate, and improved metallization bonding strength. Nickel is a preferred sintering aid in an amount of 0.1 parts to 0.4 parts on a 100 parts tungsten basis.

The bonding additive can be molybdenum oxide, tungsten oxide, niobium oxide, magnesium oxide, yttrium oxide, manganese oxide, or titanium dioxide, or mixtures thereof; titanium dioxide, yttrium oxide, and manganese oxide are preferred. Additionally, various bonding additives may also function as grain growth inhibitors for the substrate. For example, although not desirous of being constrained to a particular theory, the presence of one component (e.g., titania) may enhance the sinterability of the metallization, but during co-sintering this results in an over densification of the essentially underlying and/or adjacent substrate, thereby resulting in increased grain growth in the substrate. However, the addition of a small amount (generally $\leq 1$ wt. %, sometimes $\leq 0.5$ wt. %) of a bonding additive (e.g., magnesia) appears to reduce grain growth in the underlying substrate.

The composition also includes alumina in an amount of about 2–10%. While not desirous of being constrained to a particular theory, it is believed that the alumina further enhances the function of the bonding additive due to the formation of a new phase (e.g., $Al_2TiO_5$, $MgAl_2O_4$) at the metallization-substrate interface; and it may also be that formation of a new phase occurs between the metallization and alumina in the substrate even in the absence of alumina in the metallization formulation. Still further, the presence of alumina in the metallization compositions, especially for particles sizes similar to those from which the substrate is derived, appears to aid in matching the shrinkage of the metallization to that of the alumina substrate during co-sintering.

Preferred metallization compositions for traces and vias are slightly different: for traces, a preferred composition is 88–97% refractory metal, 2–8% alumina, 0.05–1% sintering aid, and 0.5–3% bonding additive; and for vias, a preferred composition is 84–97% refractory metal, 2–10% alumina, 0.05–5% sintering aid, and 0.5–5% bonding additive.

The present compositions are typically provided in the form of flowable inks, generally including the above-described components in a dispersion vehicle. The vehicle preferably includes a solvent, a dispersant and, optionally, a viscosity modifier.

Exemplary solvents include: alcohols, such as methanol, ethanol, $\alpha$-terpineol, and butylcarbitol acetate; methylethyl ketone (MEK); hydrocarbons, such as benzene and toluene; and the like known in the art, including mixtures thereof. The solvent is present to facilitate mixing and is subsequently removed either actively by heating or passively by evaporation during mixing. Also, $\alpha$-terpineol and butylcarbitol acetate (referred to hereinafter as BCA) have relatively slow evaporation rates, and thus can also function as viscosity modifiers (discussed below).

Exemplary dispersants include: polymeric polyelectrolytes, such as those based on acrylic acid and including sodium and/or ammonium salts (e.g., Narlex LD-42 and LD-45, available from National Starch Co., Bridgewater, NJ, and Darvan C and 821A, available from R. T. Vanderbilt & Co., Norwalk, CT); sodium, potassium, or ammonium polyphosphates and pyrophosphates; amines, such as di- or trialkylamines (e.g., diethylamine, tripropylamine), di- or trialkanolamines (e.g., triethanolamine), N,N-diethylethanolamine, polyethylene imines (e.g., Corcat P-600 (MW=600,000) and Corcat P-12 (MW=12,000), available from Virginia Chemical, Portsmouth, VA), morpholine, and other amine dispersants known in the art; polyelectrolytes including quaternary ammonium salts (e.g., Emcol CC-55 and CC-42, available from Witco Chem. Corp., Houston, TX); polyethylene glycols and polyoxyalkylene derivatives of propylene glycol (e.g., Pluronic L-12, available from BASF-Wyandotte Corp., Parsippany, NJ); polyvinylpyrrolidone; vinylacetates; and the like, and mixtures thereof.

Exemplary viscosity modifiers include polyvinyl alcohol, cellulose derivatives (e.g., ethylcellulose derivatives such as those designated EC, available from Hercules Inc., Wilmington, DE; methylcellulose; cellulose ethers such as that designated Methocel, available from Dow Chemical, Midland, MI), glycols such as polyethylene glycol and methoxypolyethylene glycol (e.g., Carbowax, available from Union Carbide, NY, NY), $\alpha$-terpineol, butylcarbitol acetate (BCA), and the like, and mixtures thereof.

Ink formulations are typically applied by a screen printing method. The viscosity of the formulation can be varied as desired; typically, trace inks have a lower viscosity and via inks have a higher viscosity (so that the applied ink remains in the via hole). Solids loading for the inks can range from about 25 vol. % solids to about 50 vol. %, most preferably about 40–45 vol. %; at lower loadings the sintered metallization becomes more porous, and at higher loadings (especially with a dense powder such as tungsten), providing an ink that is easily printable becomes much more difficult.

Specific embodiments of the invention are further described by the following examples, which are meant to be illustrative and in no manner limiting. As used below, the term "standard vehicle" refers to a 75/25 mixture (weight basis) of BCA/$\alpha$-terpineol (referred to below as the "standard solvent") plus dispersant (generally 10% of the amount of the BCA/$\alpha$-terpineol mixture) plus ethylcellulose (generally 18 wt. % based on the BCA/$\alpha$-terpineol, unless otherwise noted).

EXAMPLE 1

Into a container were placed the approximate amounts of the following:
36 g. tungsten powder M-40
54 g. tungsten powder M-10
9 g. magnesium oxide powder
1 g. nickel powder
25 g. MEK
11 g. standard vehicle These components were agitated and the resulting composition was fluid. The MEK was then evaporated to provide a composition of a nearly constant weight, and this procedure yielded a very viscous slurry. Thereafter, 2.5 g. of the standard solvent was added to reduce the viscosity.

EXAMPLE 2

Following a procedure similar to that described in the foregoing example, the approximate amounts of the following components were admixed:
36 g. tungsten powder M-40
54 g. tungsten powder M-10
7 g. alumina powder (grade A-16SG, available from Aluminum Co. of America, Pittsburgh, PA)
1 g. nickel powder
2 g. magnesium oxide powder
25 g. MEK
11 g. standard vehicle (15 wt. % ethylcellulose)

The mixture was agitated for about one minute, during which time about 2.2 g. of the standard vehicle was added. The MEK solvent had evaporated during the mixing to yield a composition of about 40% by volume of solids. The mixture was dried to nearly constant weight and deaired for about 5 minutes in a vacuum dessicator. Thereafter, about 0.5 g. of the standard vehicle was added to reduce the viscosity.

EXAMPLE 3

An approximately 25% by volume solids ink was prepared by ball milling a mixture of the approximate amounts of the following:

92.9 g. tungsten powder (M-20)
6.0 g. alumina
1.0 g. titanium dioxide
0.1 g. nickel
19.0 g. of the standard vehicle MEK was added to thin the slurry for improved mixing. After ball milling, the MEK solvent was removed by heating the slurry while stirring. The ink was then passed through a 325 s.s. mesh screen and was ready for use.

For all of the following examples, the substrates were derived from alumina particles having a mean particle size of about 0.05–0.8 microns, having 0.2% impurities in the alumina, and about 0.2–0.3% of an alumina-magnesia spinel added to inhibit grain growth; thereby resulting in a 99.5–99.6% alumina substrate. The substrates are preferably made in accordance with assignee's co-pending U.S. patent application Ser. Nos. 06/935,513, filed Nov. 26, 1986, now U.S. Pat. No. 4,796,294 and 07/125,320, filed Nov. 27, 1987, both of which are incorporated herein by reference.

EXAMPLES 4–13

Various ink formations were prepared as described above, printed onto an alumina substrate, sintered, and tested for resistance and adhesions. Resistances are given below in ohms per trace pattern; a resistance of less than about 8 is considered acceptable. Adhesion was determined by a 90 pull test on a pin brazed to a 100 mil square pad (i.e., 0.1 in.×0.1 in.), with the values given below in kpsi (psi×1000); an adhesion value of greater than about 5 is considered acceptable. Ink viscosity was measured using a Brookfield cone and plate viscometer with a CP-51 spindle at 1 rpm.

| Example | Composition | Viscosity | Resistance | Adhesion |
|---|---|---|---|---|
| 4 | 90% W<br>7% $Al_2O_3$<br>2% MgO<br>1% Ni | 322,000 | some opens in traces | <0.5 |
| 5 | 90% W<br>7% $Al_2O_3$<br>3% MgO | 308,000 | 9.5 | 8.1 |
| 6 | 90% W<br>9% MgO<br>1% Ni<br>(composition of Example 1) | 279,000 | 6.2 | <0.5 |
| 7 | 90.92% W<br>7.0% $Al_2O_3$<br>2.0% $Y_2O_3$<br>0.08% Ni | 118,000 | 6.6 | 5.2 |
| 8 | 90.9% W<br>6.0% $Al_2O_3$<br>3.0% $TiO_2$<br>0.1% Ni | 82,400 | 4.8 | >12.5 |
| 9 | 92.9% W<br>6.0% $Al_2O_3$<br>1.0% $TiO_2$<br>0.1% Ni | | 7.4 | >12.5 |
| 10 | 100% W | | 2.8 | <0.5 |
| 11 | 97.39% W<br>1.55% $Al_2O_3$<br>0.56% $Y_2O_3$<br>0.50% Ni | | 2.7 | <0.5 |
| 12 | 90% W<br>7% $Al_2O_3$<br>2% $Y_2O_3$<br>1% Ni | | 5.3 | 2.6 |
| 13 (a) | 93% W<br>6.4% $Al_2O_3$<br>0.6% $Y_2O_3$ | 214,000 | 4.7 | 5.8 |
| 13 (b) | 93% W<br>6.4% $Al_2O_3$<br>0.6% $Y_2O_3$ | 94,400 | 4.9 | 8.9 |
| 13 (c) | 93% W<br>6.4% $A_2O_3$<br>0.6% $Y_2O_3$ | 56,000 | 5.9 | >12.0 |

Examples 4–7, and 10 were prepared from a 60/40 mixture of M-10/M-40 tungsten powders, the other examples were prepared from M-20 tungsten powder. Examples 13(a)–(c) illustrate the affect of the ink viscosity on the resistance and adhesion values, as mentioned above.

EXAMPLES 14–19

The following compositions were prepared as above, based on 93% W, 1% bonding additive, 5.9% alumina (A-16SG), and 0.1% Ni, with the following results:

| | Example | | | | | |
|---|---|---|---|---|---|---|
| | 14 | 15 | 16 | 17 | 18 | 19 |
| additive | $TiO_2$ | $Nb_2O_5$ | $WO_2$ | $MoO_3$ | CaO—$SiO_2$ | MnO |
| resistivity | 20.2 | 42.2 | 38.7 | 20.7 | 22.2 | 17.0 |
| adhesion | 17.0 | <1. | <1. | 18.1 | <1. | 17.4 |

Sheet resistivity is in m-ohm/square; adhesion is in kpsi.

EXAMPLE 20

A metallization composition was made composed of 92.75% W (all M-40), 1% $TiO_2$, 6% A-16SG, and 0.25% Ni. The resulting sintered metallization exhibited a sheet resistivity of 10.8 m-ohm/square (average sintered trace of 271 microns wide by 24.3 microns thick) and an adhesion of about 14.2 kpsi.

EXAMPLE 21

A metallization composition was made composed of 92.75% W (one-third each of M-10, M-20, and M-40), 1% MnO, 6% A-16SG, and 0.25% Ni. The resulting sintered metallization exhibited a sheet resistivity of 18.0 m-ohm/square (average sintered trace of 264 microns wide by 21.6 microns thick) and an adhesion of 14.6 kpsi.

EXAMPLE 22

A metallization composition was made composed of 93.3% W (one-third each of M-10, M-20, and M-40), 0.5% $TiO_2$, 6% alumina (mean particle size range of 0.5 to 0.8 micron) and 0.2% Ni. The resulting sintered metallization exhibited an adhesion of 9.1 kpsi.

EXAMPLES 23–24

The following examples exhibit the effect of solids loading upon the desired properties. It should be noted that solids loading with respect to the desired properties is also a function of the particular composition (see, e.g., Example 25).

| (23) | 93.3% W (one-third each M-10, M-20, and M-40) |
| --- | --- |
| | 0.2% Ni |
| | 6.0% A-16SG |
| | 0.5% TiO$_2$ |

For a solids loading of about 45 vol. %, adhesion was 9.1 kpsi.

| (24) | 93.4% W (M-40) |
| --- | --- |
| | 0.1% Ni |
| | 6.0% A-16SG |
| | 0.5% TiO$_2$ |

For a solids loading of about 25 vol. %, adhesion was <1 kpsi.

EXAMPLE 25

A metallization ink was made composed of the following approximate amounts: 93% W (M-20); 6.4% A-16SG; and 0.6% Y$_2$O$_3$. The viscosity was about 90,000 (as measured above) and the solids loading was about 25 vol. %. After co-sintering, the bulk resistivity was 10.7 and the adhesion was 25.7 pounds (26.7 kpsi).

EXAMPLE 26

A metallization ink was made composed of the following approximate amounts: 92.75% W (one-third each of M-10, M-20, and M-40); 0.25% Ni; 6% A-16SG; and 1% MnO. Adhesion after co-firing was 15.0 kpsi.

EXAMPLES 27-30

These examples illustrate the effect of the sintered trace thickness on adhesion and resistivity. All of the compositions included 92.75% W (M-40), 1% TiO$_2$, 6% A-16SG, and 0.25% Ni.

| | Example | | | |
| --- | --- | --- | --- | --- |
| | 27 | 28 | 29 | 30 |
| Trace | 12 | 18 | 20 | 33 |
| Resistivity | 24.6 | 13.9 | 12.5 | 9.6 |
| Adhesion | 10.7 | 12.4 | 17.4 | 17.0 |

Trace thickness is given in microns; sheet resistivity is given in m-ohm/sq; and adhesion is given in kpsi.

The present invention provides metallization compositions suitable for any ceramic essentially devoid of glass (i.e., ≦1 wt. %), such as aluminum nitride and beryllium oxide. Moreover, for compositions such as aluminum nitride, which sinters at a much higher temperature than aluminum oxide (i.e., 1700° versus about 1550° C., respectively), it may be possible to completely omit the sintering aid for the refractory metal due to the higher sintering temperature. The foregoing description is designed to illustrate various specific embodiments of the invention. Various modifications, additions, and other changes to these embodiments may become apparent to a skilled artisan upon reviewing this specification. However, such changes are intended to be within the scope and spirit of the present invention as defined by the claims.

That which is claimed is:

1. A ceramic body essentially devoid of glass and composed of >96% alumina and having co-sintered metallization, the metallization derived from a composition having a metallizing portion consisting essentially of 84-97% refractory metal, 2-10% alumina, 0.05-5% sintering aid, and 0.5-5% bonding additive selected from the group consisting of the oxides or molybdenum, tungsten, niobium, manganese, yttrium, titanium and mixtures of such oxides.

2. The ceramic body as defined by claim 1, wherein the metallization is a circuit trace and consists essentially of 88-97% refractory metal, 2-8% alumina, 0.05-1% sintering aid, and 0.5-3% bonding additive.

3. The ceramic body as defined by claim 1, wherein the metallization is a via and consists essentially of 84-97% refractory metal, 2-10% alumina, 0.05-5% sintering aid, and 0.5-5% bonding additive.

4. The ceramic body as defined by claim 1, wherein the refractory metal is tungsten, molybdenum, or mixtures thereof.

5. The ceramic body as defined by claim 1, wherein the sintering aid is nickel, cobalt, palladium, manganese, an oxide thereof, or mixtures thereof.

6. The ceramic body as defined by claim 1, wherein the ceramic is at least 98% alumina.

7. The ceramic body as defined by claim 6, wherein the ceramic is at least 99% alumina.

8. The ceramic body as defined by claim 1, wherein the sintering aid is present in an amount of approximately 0.05-0.50%.

9. The ceramic body as defined by claim 1, wherein the co-sintered metallization defines a trace pattern on a surface of the body.

10. The ceramic body as defined by claim 1, wherein the co-sintered metallization defines a via through the body.

11. The ceramic body as defined by claim 1, wherein the body is composed of at least two ceramic layers.

12. The ceramic body as defined by claim 11, wherein at least two of the ceramic layers have co-sintered metallization.

13. A metallization composition, comprising:
(a) a metallization portion consisting essentially of:
  84-97% refractory metal,
  2-10% alumina,
  0.05-5% sintering aid,
  0.5-5% bonding additives elected from the group consisting of the oxides or molybdenum, tungsten, niobium, manganese, yttrium, titanium and mixtures of such oxides; and
(b) an organic vehicle.

14. The metallization composition as defined by claim 13, wherein the metallization portion consists essentially of:
  8-97% refractory metal;
  2-8% alumina;
  0.05-1% sintering aid; and
  0.5-3% bonding additive.

15. The metallization composition as defined by claim 13, wherein the metallization is in the form of an ink having a viscosity of less than about 100,000 cps at 1 rpm.

16. The metallization composition as defined by claim 13, where the metallization portion provides a solids loading of from about 25% to about 50% by volume.

17. The metallization composition as defined by claim 16, wherein the solids loading is from about 40% to about 45% by volume.

18. The metallization composition as defined by claim 13, wherein the sintering aid is nickel, cobalt, palladium, manganese, an oxide thereof, or mixtures thereof.

19. A ceramic composite, comprising:
(a) a ceramic substrate having not more than about 1 wt. % glass; and
(b) a metallized path suitable for a circuit trace or a via, the path consisting essentially of 84–97 wt. % refractory metal, 2–10 wt. % alumina, $\leqq 5$ wt. % sintering aid, and 0.5–5 wt. % bonding additives elected form the group consisting of oxides of molybdenum, tungsten, niobium, manganese, yttrium, titanium and mixtures of such oxides.

20. The composite defined by claim 19, wherein the substrate is selected from those essentially composed of aluminum oxide, aluminum nitride, and beryllium oxide.

* * * * *